United States Patent
Tanaka

(10) Patent No.: US 8,237,060 B2
(45) Date of Patent: Aug. 7, 2012

(54) METHOD FOR MANUFACTURING MULTILAYER PRINTED WIRING BOARD

(75) Inventor: Hironori Tanaka, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 276 days.

(21) Appl. No.: 12/409,826

(22) Filed: Mar. 24, 2009

(65) Prior Publication Data

US 2009/0244865 A1 Oct. 1, 2009

Related U.S. Application Data

(60) Provisional application No. 61/094,096, filed on Sep. 4, 2008, provisional application No. 61/040,011, filed on Mar. 27, 2008.

(51) Int. Cl.
*H05K 1/16* (2006.01)

(52) U.S. Cl. ........................................ 174/260

(58) Field of Classification Search .............. 174/260, 174/261; 361/760, 761, 792–795
See application file for complete search history.

(56) References Cited

U.S. PATENT DOCUMENTS

| | | | |
|---|---|---|---|
| 2008/0202801 A1 | 8/2008 | Tuominen et al. | 174/260 |
| 2009/0293271 A1* | 12/2009 | Tanaka | 29/832 |

FOREIGN PATENT DOCUMENTS

| | | |
|---|---|---|
| JP | 11-195745 A | 7/1999 |
| JP | 2001-332863 | 11/2001 |
| JP | 2002-246757 | 8/2002 |
| JP | 2003-8206 | 1/2003 |
| JP | 2003-086634 A | 3/2003 |
| JP | 2007-189202 | 7/2007 |
| JP | 2007-266197 | 10/2007 |
| JP | 2007-335764 | 12/2007 |

OTHER PUBLICATIONS

U.S. Appl. No. 12/325,498, filed Dec. 1, 2008, Tanaka.

* cited by examiner

*Primary Examiner* — Javaid Nasri
(74) *Attorney, Agent, or Firm* — Oblon, Spivak, McClelland, Maier & Neustadt, L.L.P.

(57) ABSTRACT

A method for manufacturing a multilayer printed wiring board having an electronic component housed therein includes forming a first conductor circuit on a first surface of a substrate. A first alignment mark is formed on the first surface of the substrate separate from the conductor circuit and forming a through bore in the substrate, the through bore extending from the first surface of the substrate to a second surface of the substrate. A seal member is disposed on the second surface of the substrate, the seal member sealing an opening on the second surface of the through bore to provide a sealed through bore. An electronic component is inserted in the sealed through bore using the first alignment mark on the first surface of the substrate.

18 Claims, 16 Drawing Sheets

(A)

(B)

(C)

(D)

METHOD FOR MANUFACTURING MULTILAYER PRINTED WIRING BOARD

CROSS-REFERENCE TO RELATED APPLICATIONS

The present application claims the benefits of priority to U.S. Application Nos. 61/040,011, filed Mar. 27, 2008 and 61/094,096 filed Sep. 4, 2008. The contents of those applications are incorporated herein by reference in their entirety.

BACKGROUND OF THE INVENTION

1. Field of Invention

The present invention relates to a method for manufacturing a build-up multilayer printed wiring board, and more particularly to a method for manufacturing a multilayer printed wiring board having electronic components such as active devices such as an IC chip and passive devices such as a chip capacitor built therein.

2. Discussion of the Background

Integrated circuit (IC) chips have been electrically connected to a printed wiring board by a mounting method such as wire bonding, tape automated bonding (TAB), and a flip chip. Further, chip capacitors have been surface-mounted on a substrate. In the method for mounting the IC chip, the IC chip has been electrically connected to the printed wiring board through lead components for connection (wire, lead, bump) interposed therebetween. Since lead components of this type can be cut off and corroded, they may be disconnected from the IC chip and the IC chip may malfunction. Further, when the chip capacitor is surface-mounted, the wiring length thereof to the IC chip is increased, which may cause undesirable electrical characteristics.

SUMMARY OF THE INVENTION

An object of the present invention is to propose a method for manufacturing a multilayer printed wiring board capable of making proper connection to the terminal of a built-in electronic component.

According to an aspect of the present invention, a method is provided for manufacturing a multilayer printed wiring board having an electronic component housed therein. The method includes forming a first conductor circuit on a first surface of a substrate, forming a first alignment mark on the first surface of the substrate separate from the conductor circuit and forming a through bore in the substrate, the through bore extending from the first surface of the substrate to a second surface of the substrate. A seal member is disposed on the second surface of the substrate, the seal member sealing an opening on the second surface of the through bore to provide a sealed through bore. An electronic component is inserted in the sealed through bore using the first alignment mark on the first surface of the substrate.

Another aspect of the invention provides a method for manufacturing a multilayer printed wiring board having an electronic component housed therein. The method includes forming a passivation layer over a connection terminal of the electronic component, forming an opening in the passivation layer to expose the connection terminal and forming an intermediate conductor in contact with the connection terminal. Also included is forming a conduction circuit on a substrate, forming an alignment mark on the substrate separate from the conduction circuit and forming a through-bore in the substrate. The electronic component having the intermediate conductor thereon is inserted into the through bore in the substrate by using the first alignment mark on the substrate to align the electronic component with the through bore.

In still another aspect, a multilayer printed wiring board includes a substrate having a through bore formed therein, an electronic component having a connection terminal and housed within the through bore in the substrate and at least one interlayer insulating layer provided on the substrate and on the electronic component such that the electronic component is embedded within the multilayer printed wiring board. A conductor is provided on a surface of the interlayer insulating layer and at least one via structure electrically connecting the conductor of the interlayer insulating layer with the connector terminal of the electronic component. At least one alignment mark is embedded within the multilayer printed wiring board, the at least one alignment mark not being electrically connected to the connection terminal or and not being electrically connected to the conductor, wherein the alignment mark provides a mechanism for aligning the electronic component with the during assembly of the multilayer printed wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
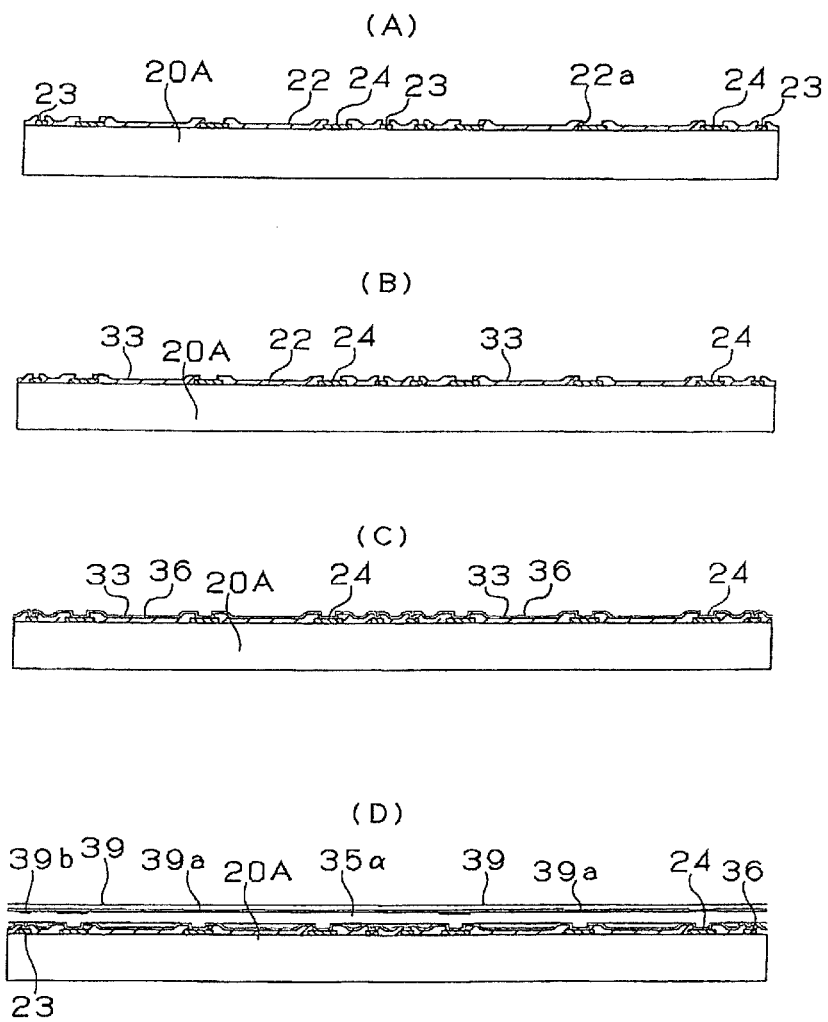
FIGS. 1A to 1D show steps of manufacturing a multilayer printed wiring board according to a first embodiment of the present invention.
Figure 2:
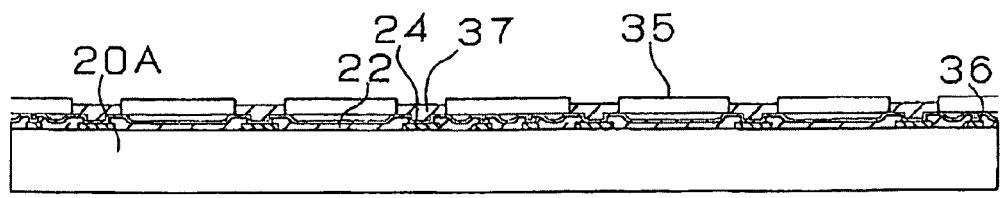
FIGS. 2A to 2D show steps of manufacturing the multilayer printed wiring board according to the first embodiment.
Figure 2:
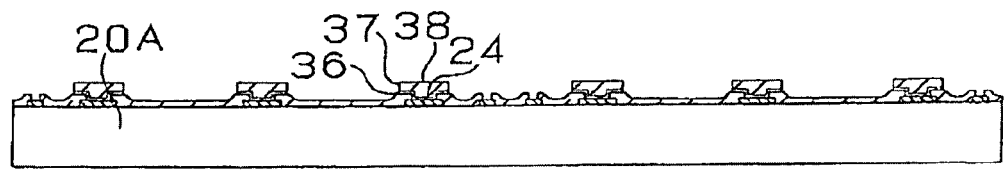
Figure 2:
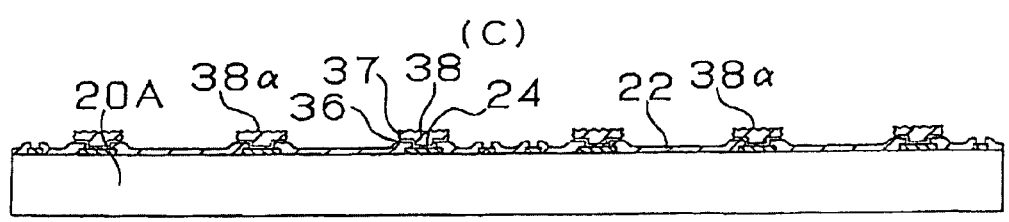
Figure 2:
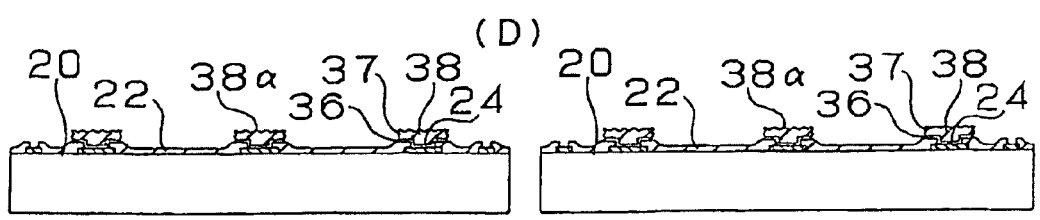

As noted above, lead connections may become disconnected from an IC chip, and surface mounted chip capacitors may require a long wiring length to an IC. To cope with the above problem, Japanese Patent Application Laid-Open (JP-A) Nos. 2001-332863 and 2002-246757 disclose methods for manufacturing a printed wiring board which has an IC chip built in a package substrate by accommodating the IC chip in a recess formed on a core substrate and laminating an interlayer resin insulation layer and a conductor circuit on the core substrate.

However, in the manufacturing method disclosed in JP-A 2001-332863, a recess acting as an alignment mark is formed on the substrate by laser, and a resin residue may remain in the recess. Thus, alignment to the alignment mark by image recognition may not be accurately performed due to the irregularity of the residue. Accordingly, since a pad of the IC chip is dislocated from a via-hole, the pad may not be electrically connected to the via-hole. The contents of these publications are incorporated herein by reference in their entirety.

The embodiments will now be described with reference to the accompanying drawings, wherein like reference numerals may designate corresponding or identical elements throughout the various drawings.

First Embodiment

Figure 7:
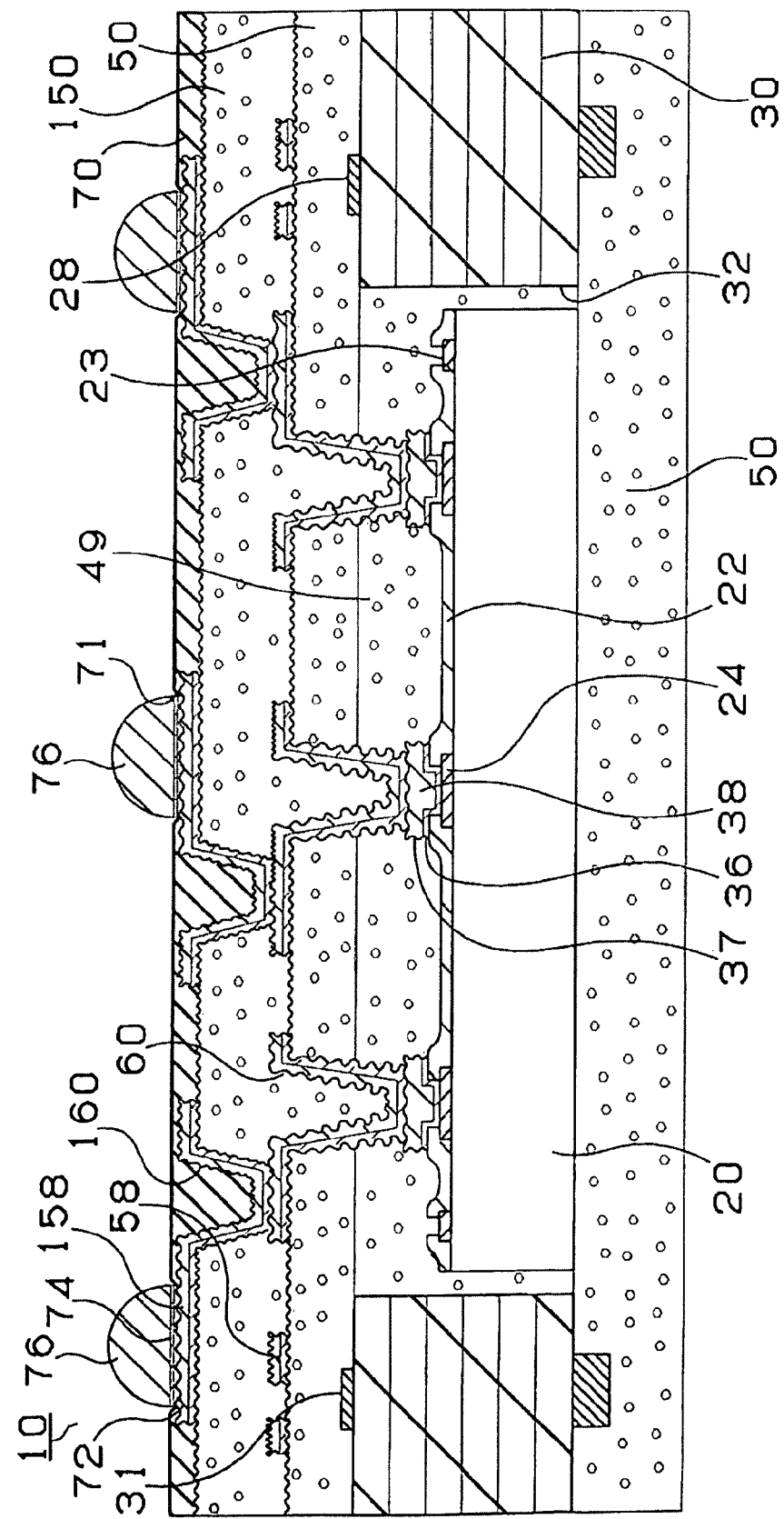
FIG. 7 is a sectional view of the multilayer printed wiring board according to the first embodiment.

Embodiments of the present invention will be described below referring to the drawings. First, an arrangement of a multilayer printed wiring board 10 according to a first embodiment of the present invention will be described referring to FIG. 7. FIG. 7 shows a cross section of the multilayer printed wiring board 10.

As shown in FIG. 7, the multilayer printed wiring board 10 is composed of a core substrate 30 for accommodating an IC chip 20, an interlayer resin insulation layer 50, and an interlayer resin insulation layer 150. Via-holes 60 and conductor circuits 58 are formed above the interlayer resin insulation layer 50, and via-holes 160 and conductor circuits 158 are formed on the interlayer resin insulation layer 150.

The IC chip 20 is covered with a passivation film 22, and a die pad (pad) 24 constituting an input/output terminal and a positioning mark 23 are disposed in each opening of the passivation film 22. An intermediation layer 38 mainly composed of copper is formed on each pad 24 in FIG. 7.

A solder resist layer 70 is disposed on the interlayer resin insulation layer 150. Solder bumps 76 are disposed to the conductor circuits 158 under openings 71 of the solder resist layer 70 so that they are connected to an external substrate such as a daughter board and a mother board, which are not shown.

In the multilayer printed wiring board 10 of the embodiment, the IC chip 20 is previously built in the core substrate 30, and the intermediation layers 38 are disposed on the pads 24 of the IC chip 20. Accordingly, the IC chip can be electrically connected to the multilayer printed wiring board (package substrate) without using a lead component and a sealing resin.

Remains of a resin on the die pad 24 can be prevented by disposing the copper intermediation layer 38 on the die pad 24. Further, even if the pad 24 is dipped in acid, oxidant, or an etching solution or subjected to various annealing steps in post-processing, the pad 24 is neither discolored nor dissolved. With this arrangement, connectivity between the pad of the IC chip and the via-hole and the reliability can be improved. Further, since the intermediation layer 38 having a diameter of 60 μm or more is interposed between the pad 24 having a diameter of 40 μm and the via-hole 60 having a diameter of 60 μm, the pad 24 can be securely connected to the via-hole 60.

Further, in the manufacturing steps to be described later, the IC chip 20 is positioned using an alignment mark 31 formed on the core substrate 30 as a reference, and the via-hole 60, to which the pad 24 of the IC chip 20 is connected, is formed in alignment with the alignment mark 31. Accordingly, the via-hole 60 can be accurately aligned on the pad 24 of the IC chip 20, thereby the pad 24 can be securely connected to the via-hole 60.

Subsequently, the method for manufacturing the multilayer printed wiring board described above referring to FIG. 7 will be described referring to FIGS. 1 to 6. First, a step of forming an intermediation layer 38 on the pad of the IC chip will be described referring to FIGS. 1 and 2 and the following numbered steps.

The pad 24, a positioning mark 23, a wiring (not shown) are formed on a silicon wafer 20A shown in FIG. 1A. A passivation film 22 is covered on a die pad 24, the alignment mark 23, and the wiring (not shown). The passivation film 22 has an opening 22a formed on the die pad 24 and the alignment mark 23.

Then, a conductive metal film (thin film layer) 33 is formed on the whole surface of the silicon wafer 20A by physical vapor deposition such as vapor deposition and sputtering (FIG. 1B). The metal film is formed of at least one metal such as tin, chromium, titanium, nickel, zinc, cobalt, gold, and copper. In particular, the metal film is preferably formed of nickel, chromium, and titanium. This is because, since no moisture penetrates from an interface, an excellent close contact property of metal can be obtained. The metal film 33 may be formed of two or more layers of different metals. The metal film 33 is preferably formed in a thickness from 0.001 to 2.0 μm. More particularly, the metal film 33 is preferably formed in a thickness from 0.01 to 1.0 μm.

A plating film 36 may be further formed on the metal film 33 by nonelectrolyte plating (FIG. 1C). Copper, nickel, gold, and silver are used as a type of metal used for plating. Copper is preferably used for the plating in consideration of the electric characteristics and the economic efficiency thereof and further in consideration that a conductor layer, which is a built-up formed in the post-processing, is mainly composed of copper. The plating film 36 is preferably formed in a thickness within the range from 0.01 to 5.0 μm. When the thickness is less than 0.01 μm, the plating film cannot be formed on the whole surface of the metal film 33, whereas when it exceeds 5.0 μm, the plating film is unlikely to be removed by etching or the alignment mark is buried in the plating film and cannot be recognized. Accordingly, the preferable range of the thickness is from 0.1 to 3.0 μm. Note that preferable combinations of a first thin film layer and a second thin film layer are chromium-copper, chromium-nickel, titanium-copper, and titanium-nickel. These combinations are superior to the other combinations in terms of the joint property and the electric transmission property to other metals.

Thereafter, a resist 350L is applied, and a mask 39, to which a pattern 39a and an alignment mark 39b corresponding to each pad 24 are written, is placed (FIG. 1D). The mask 39 is positioned by radiating light from above so that the alignment mark 23 of the silicon wafer 20A is set within the alignment mark 39*b* and picking up an image by a camera 80 through the light reflected from the alignment mark 23. In the embodiment, since the copper plating film 36 is also formed on the alignment mark 23, the reflection light is liable to transmit through the resist 35α, thereby the substrate can be easily aligned with the mask.

A plating resist 35 is formed so that an opening is formed on each pad 24 of the silicon wafer 20A by exposure and development, and an electrolytic plating film 37 is formed by performing electrolytic plating (FIG. 2A). After the plating resist 35 is removed, the intermediation layer 38 is formed on each pad 24 of the IC chip by removing the nonelectrolyte plating film 36 and the metal film 33 under the plating resist 35 (FIG. 2B). Although the intermediation layer 38 is formed by the plating resist here, it is also possible to form the intermediation layer on each pad of the IC chip by forming an etching resist on the nonelectrolyte plating film 36 after an electrolytic plating film is formed on the nonelectrolyte plating film 36, and performing etching by exposing the metal in the portions other than the intermediation layer through exposure and development. The electrolytic plating film can be formed of nickel, copper, gold, silver, zinc, and iron. The electrolytic plating film is preferably formed in a thickness within the range of 1 to 20 µm. This is because, when the thickness is made larger than the above range, undercut occurs when the etching is performed, thereby a gap may be formed in the interface between the formed intermediation layer and the via-hole.

Next an etching solution is sprayed onto the silicon wafer 20A so that the surface of the intermediation layer 38 is etched to form a roughed surface 38α (refer to FIG. 2C). The roughed surface can also be formed using nonelectrolyte plating and oxidation-reduction processing.

Finally, the silicon wafer 20A to which the intermediation layer 38 is formed is cut off to individual pieces by dicing and the like to form the IC chips 20 (refer to FIG. 2D). Thereafter, the divided IC chips 20 may be subjected to an operation confirming test and an electric examination when necessary. Since the intermediation layer 38 larger than the pad 24 is formed above the IC chip 20, a probe pin can be easily applied to the IC chip 20, thereby an accuracy of examination can be increased.

Next, accommodating the IC chip 20 to the core substrate 30 will be described in the following numbered steps.

Figure 3:
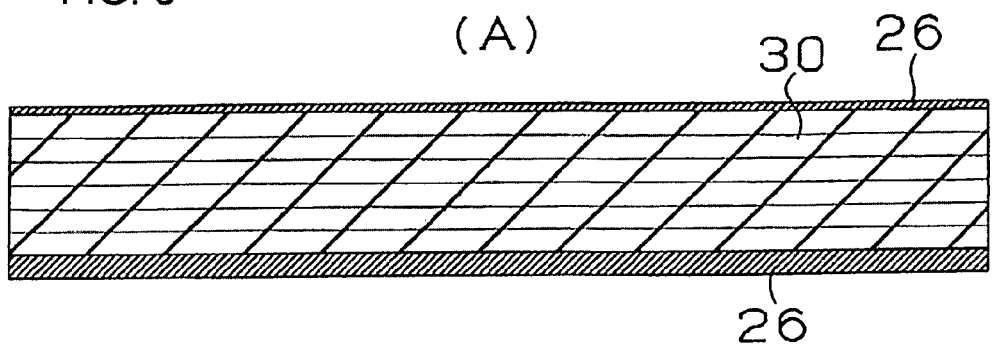
FIGS. 3A to 3D show steps of manufacturing the multilayer printed wiring board according to the first embodiment.
Figure 3:
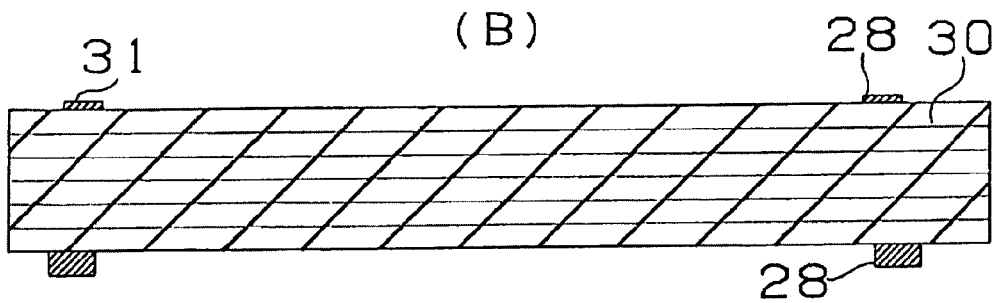
Figure 3:
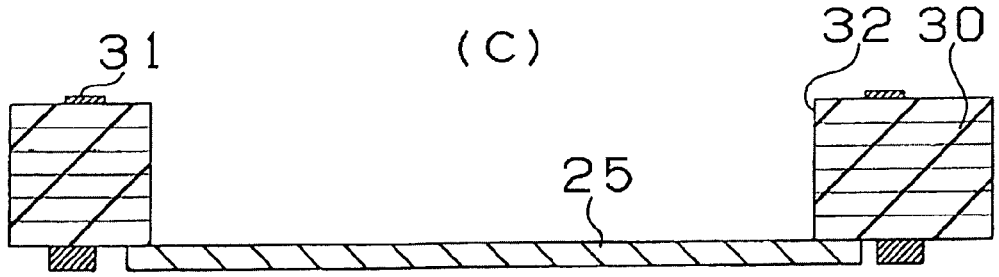
Figure 3:
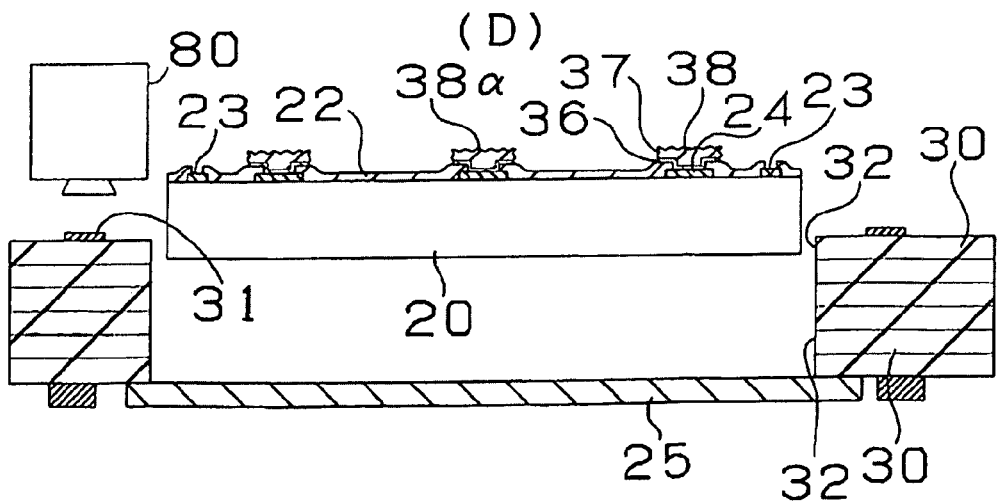
Figure 4:
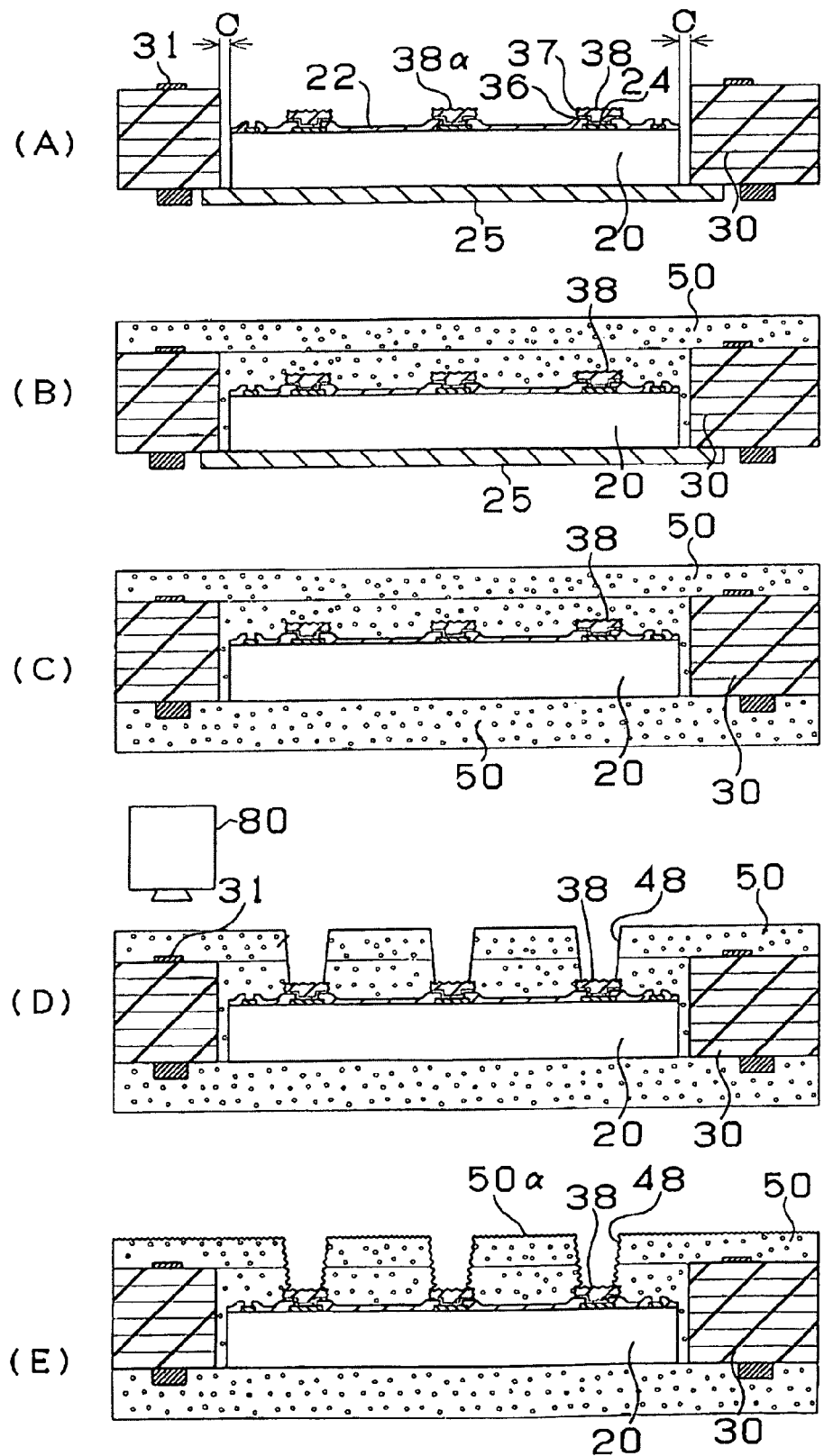
FIGS. 4A to 4E show steps of manufacturing the multilayer printed wiring board according to the first embodiment.

(1) First, an insulation resin substrate (core substrate) 30 composed of a one-surface-copper-bonded and laminate sheet, which is prepared by overlapping prepregs, each of which is composed of a core material such as a glass cloth impregnated with a resin such as epoxy and laminating the prepregs on one surface of a copper foil 26, is used as a start material (refer to FIG. 3A). An etching resist having a predetermined pattern is formed on the copper foil 26, the copper foil 26 in the portion in which the etching resist is not formed is removed, and the positioning mark 31 and a conductor circuit 28 are formed by separating the etching resist (refer to FIG. 3B). In the embodiment of FIG. 3, the alignment marks 31 are formed simultaneously with the conductor circuit 28, but this is not necessary for the present invention. Next, a through bore 32 for accommodating the IC chip is formed in the core substrate 30, and a resin tape 25 is bonded onto the bottom of the through bore 32 (refer to FIG. 3C). In this case, the through bore 32 can be opened using any of drilling, laser, router processing, and metal mold processing. Further, it is preferable that the resin tape of this case have an adhesive property at a room temperature. At the time, the resin tape having a size slightly lager than the through bore may be bonded on a part of the core substrate or the resin tape may be formed on the whole surface of the core substrate. Although the through bore is formed here by processing, a core substrate having the accommodating portion can also be formed by bonding insulation resin substrates each having an opening. However, the insulation resin substrate is dissolved or carbonized at a temperature of 350° C. or higher.

(2) Thereafter, the IC chip 20 is mounted on the tape 25 by aligning the position thereof on the tape 25 by use of the positioning mark 23 on the IC chip 20 using the alignment mark 31 of the core substrate 30 as a reference (refer to FIG. 3D). Then, the IC chip 20 is completely accommodated in the through bore 32 by pressing the upper surface thereof (refer to FIG. 4A). It is preferable to adjust a clearance C between a side wall of the through bore 32 of this case and the IC chip 20 accommodated in the through bore to the range of 30 to 200 µm. It is more preferable to adjust the clearance C to the range of 30 to 100 µm.

(3) A thermosetting cycloolefin resin sheet having a thickness of 50 µm is laminated on the upper surface of the substrate 30, which are subjected to the above steps, in vacuum press at a pressure of 5 kg/cm² while increasing the temperature of the cycloolefin resin sheet to 50 to 150° C., thereby to form an interlayer resin insulation layer 50 composed of the cycloolefin resin (refer to FIG. 4B). A degree of vacuum in the vacuum press is 10 mmHg. The IC chip is thus fixed in the through bore 32 because a void in the through bore 32 remaining after the IC chip 20 is accommodated in the through bore is filled with the resin which is spread out from the interlayer resin insulation layer 50 and tentatively hardened. A prepreg, which is composed of a sheet-shaped and semi-hardened core material such as glass cloth formed by being impregnated with epoxy resin, can be used as the interlayer resin insulation layer 50.

(4) The resin tape 25 on the back surface of the substrate 30 is separated, and a thermosetting cycloolefin resin sheet is laminated on the back surface of the substrate 30 in vacuum press, thereby to form an interlayer resin insulation layer 50 (refer to FIG. 4C). According to the accommodation process of the IC chip 20 to the core substrate in the embodiment, highly accurate alignment can be executed using the alignment mark 31 as a reference. As a result, it is possible to adjust the clearance C between the side wall of the through bore 32 and the IC chip 20 to the range of 30 to 200 µm. With this operation, the void in the through bore after the IC chip is accommodated therein can be securely filled with the resin spread out from the interlayer resin layer without remaining bubbles as well as the amount of the spread-out resin can be advantageously reduced. Accordingly, flatness can be secured between the interlayer resin insulation layer in an upper region of the through bore and the interlayer resin layer in the regions other than the above region. When the prepreg is used as the interlayer resin insulation layer, it is more possible to secure the flatness by the core material such as the glass cloth. Further, the IC chip can be fixed to a predetermined position of the through bore by using the resin tape that is adhesive without making it necessary to use a separate adhesive for a die attachment.

(5) Next, alignment is performed by picking up the alignment mark 31 by the camera 80 through the interlayer resin insulation layer 50, and openings 48 for via-holes each having a diameter of 80 µm are formed in the interlayer resin insulation layer 50 by a $CO_2$ gas laser having a wavelength of 10.4 µm under the condition of a beam diameter of 5 mm, a pulse width of 5.0 µsec, a mask diameter of 0.5 mm, and one shot (refer to FIG. 4D). Resin residuals in the openings 48 may be removed using chromic acid and the like. Remaining of resin on the die-pad 24 can be prevented by forming the copper intermediation layer 38 on the die pad 24, thereby the connectivity of the die pad 24 to the via-hole 60 to be described later and reliability can be improved. Further, since the intermediation layer 38 having a diameter of 60 μm or more is interposed between the pad 24 having a diameter of 40 μm and the via-hole 60 having the diameter of 60 μm, the pad 24 can be securely connected to the openings 48 for the via-holes having a diameter of 60 μm. Although the remaining resin is removed using the chromic acid in this case, desmear processing using oxygen plasma can also be performed to do the same.

(6) Next, a roughed surface 500α is formed on the interlayer resin insulation layer 50 by dipping the substrate to an oxidant such as chromic acid and permanganate (refer to FIG. 4E). The roughed surface 50α is preferably formed in the thickness range of 0.1 to 5 μm. As an example, the roughed surface 50α having a thickness of 2 to 3 μm is formed by dipping the substrate in a sodium permanganate solution of 50 g/l having a temperature of 60° C. for 5 to 25 minutes. In another example, the roughed surface 50α an be formed on the surface of the interlayer resin insulation layer 50 by subjecting the insulation layer 50 to a plasma processing by use of a device Model SV-4540 produced by ULVAC, Inc. Such a plasma processing is performed using an argon gas as an inert gas under the condition of power of 200 W, a gas pressure of 0.6 Pa, and a temperature of 70° C. for two minutes.

(7) A metal layer 52 is formed on the interlayer resin insulation layer 50 having the roughed surface 50α (refer to FIG. 5A). The metal layer 52 is formed by nonelectrolyte plating. The metal layer 52 as a plating film having a thickness in the range of 0.1 to 5 μm is formed by previously applying a catalyst such as palladium to the surface layer of the interlayer resin insulation layer 50 and dipping the substrate in a nonelectrolyte plating solution for 5 to 60 minutes. An example of the nonelectrolyte plating solution is as shown below.

[Nonelectrolyte Plating Aqueous Solution]

| | |
|---|---|
| NiSO$_4$ | 0.003 mol/l |
| tartaric acid | 0.200 mol/l |
| copper sulfate | 0.030 mol/l |
| HCHO | 0.050 mol/l |
| NaOH | 0.100 mol/l |
| α,α'-bipyridyl | 100 mg/l |
| polyethylene glycol (PEG) | 0.10 g/l |

The substrate is dipped in the above nonelectrolyte plating aqueous solution at 34° C. for 40 minutes.

Figure 5:
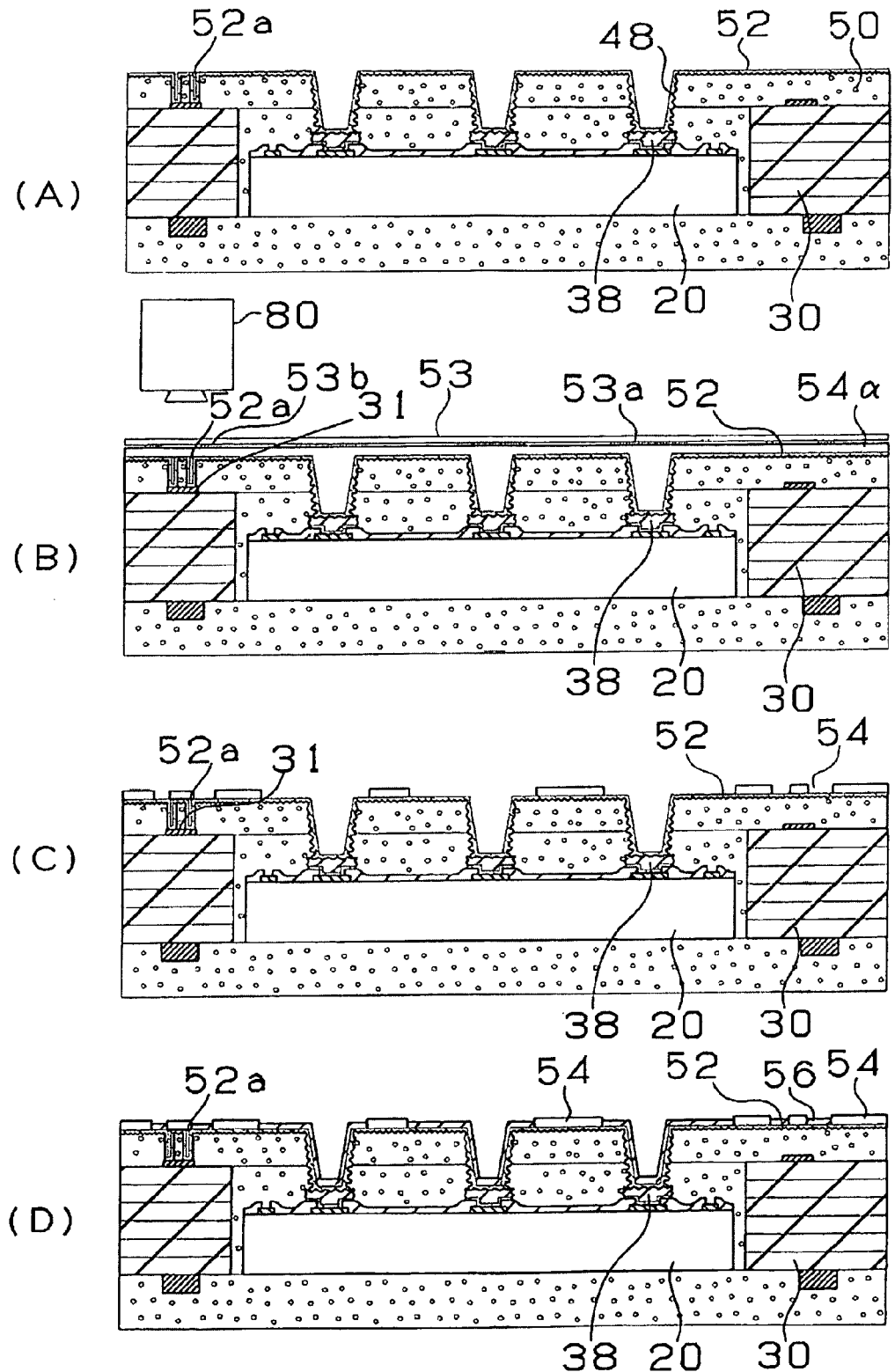
FIGS. 5A to 5D show steps of manufacturing the multilayer printed wiring board according to the first embodiment.
Figure 6:
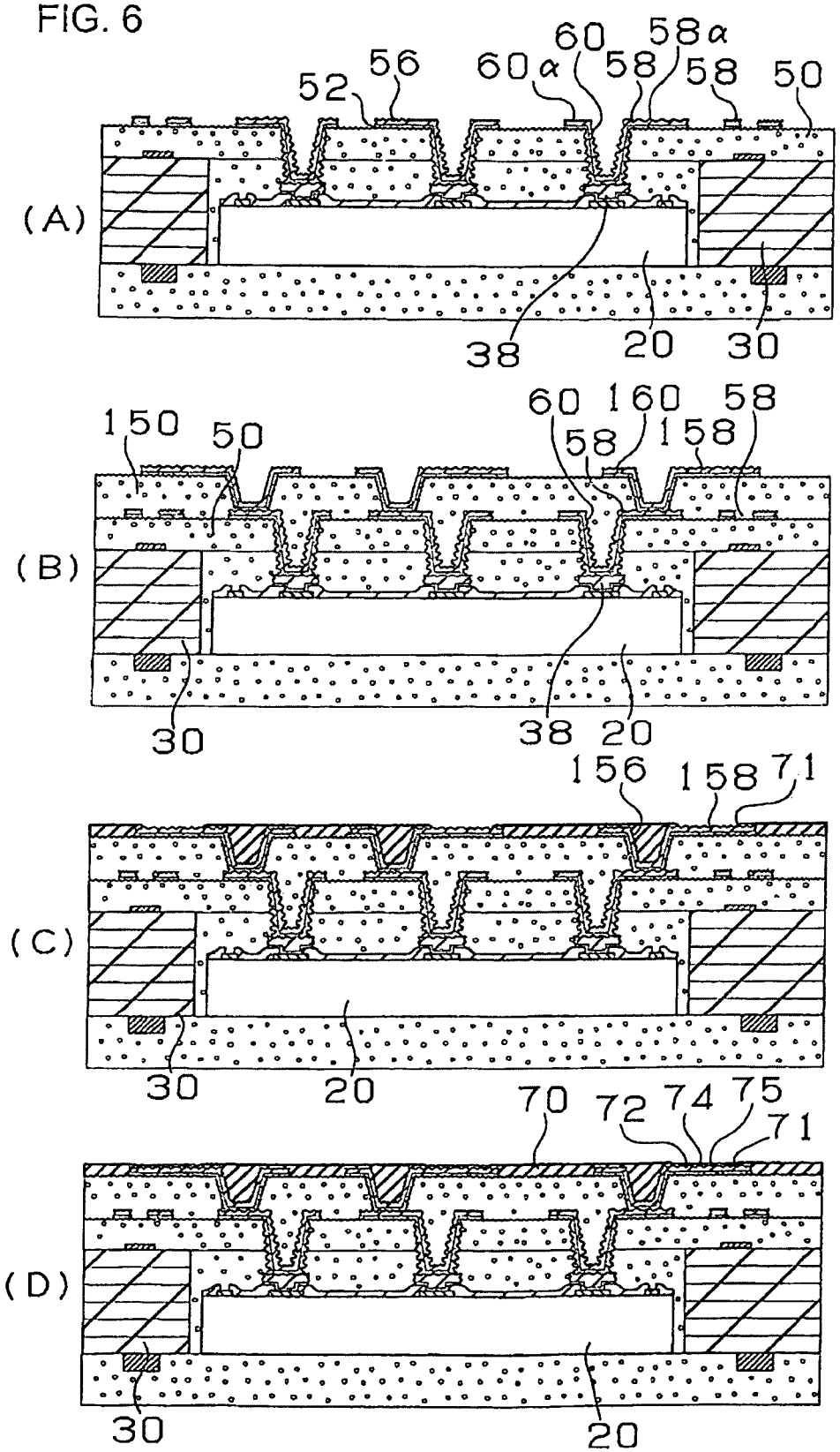
FIGS. 6A to 6D show steps of manufacturing the multilayer printed wiring board according to the first embodiment.

Additionally, a Ni/Cu metal layer 52 can also be formed on the surface of the interlayer resin insulation layer 50 by performing sputtering using Ni and Cu as a target under the condition of pressure of 0.6 Pa, a temperature of 80° C., and power of 200 W, and for 5 minutes using the same device as that used for the plasma processing described above after replacing the argon gas in the device. The Ni/Cu metal layer 52 formed in this manner has a thickness of 0.2 μm. After metallic film 52 is formed, an aperture 52a (ring shaped aperture in FIG. 5) is formed through the film 52 and interlayer resin insulating layer so to reveal at least a portion of the alignment mark 31 on the substrate. Alignment mark 52a is shown in FIG. 5, but omitted from other Figures herein.

(8) A commercially available photosensitive dry film 54α is bonded onto the substrate 30 subjected to the above processing, and a photo mask film 53 on which a pattern 53a and an alignment mark 53b (for example, ring shaped) corresponding to the pad is written is mounted on the substrate 30. The mask 53 is positioned by radiating light from above so that the alignment mark 31 on the side of the core substrate 30 is set within the ring-shaped alignment mark 53b and picking up an image by the camera 80 through the light reflected from the alignment mark 31, which is exposed through aperture 52a. Reflected light from the exposed portion of the alignment mark 31 is detected with the camera so that a ligament mark 31 is aligned with the mark 53b. Where the aperture 52a is a ring shape having a smaller diameter than the ring shaped alignment mark, the camera image will appear as concentric circles if perfect alignment is achieved. It is also possible to form a copper plating film on the alignment mark 31 as described above to increase the reflectance of the surface.

(9) Thereafter, a plating resist 54 having a thickness of 15 μm is disposed by exposing the photosensitive dry film 54α at 100 mJ/cm$^2$ and then developing it with 0.8% sodium carbonate (FIG. 5C).

(10) Next, an electrolytic plating film 56 having a thickness of 15 μm is formed by performing electrolytic plating under the condition described below (refer to FIG. 5D). In this example, an additive contained in an electrolytic plating aqueous solution is Cupracid HL produced by Atotech Japan K.K.

[Electrolytic Plating Aqueous Solution]

| | |
|---|---|
| sulfuric acid | 2.24 mol/l |
| copper sulfate | 0.26 mol/l |
| additive (Cupracid HL produced by Atotech Japan K.K.) | 19.5 ml/l |

[Electrolytic Plating Condition]

| | |
|---|---|
| current density | 1 A/dm$^2$ |
| time | 65 minutes |
| temperature | 22 ± 2° C. |

(11) After the plating resist 54 is separated and removed by 5% NaOH, the Ni—Cu alloy layer 52 under the plating resist is dissolved and removed by etching with a mixed solution of nitric acid, sulfuric acid, and hydrogen peroxide. Thereafter, the via-hole 60 and a conductor circuit 58 having a thickness of 16 μm and composed of the Ni—Cu alloy layer 52 and the electrolytic plating film 56 are formed, and roughed surfaces 58α and 60α are formed by an etching solution containing a second copper complex and an organic acid (refer to FIG. 6A).

(12) Next, the interlayer resin insulation layers 150 and the conductor circuits 158 (including the via-holes 160) as upper layers are formed by repeating the above steps (3) to (11) (refer to FIG. 6B).

(13) Next, 46.67 parts by weight of oligomer for applying photosensitivity (molecular weight: 4000), which is obtained by acrylizing 50% of epoxy group of cresol novolac type epoxy resin (produced by Nihon Kayaku Co., Ltd.) dissolved in diethylene glycol dimethyl ether (DMDG) so as to have a concentration of 60 weight percent, 15 parts by weight of 80 weight percent of bisphenol A type epoxy resin (produced by Yuka Shell Co., Ltd., trade name: Epicoat 1001) dissolved in methyl ethyl ketone, 1.6 parts by weight of imidazole hardener (produced by Shikoku Chemicals Corporation, trade name: 2E4MZ-CN), 3 parts by weight of polyfunctional acrylic monomer (produced by Kyoei Kagaku Kogyo K.K., trade name: R604) as a photosensitive monomer, 1.5 parts by weight of multivalent acrylic monomer (produced by Kyoei Kagaku Kogyo K.K., trade name: DPE6A), and 0.71 part by weight of a dispersing antifoaming agent (produced by SAN NOPCO LIMITED, trade name: S-65) are put into a vessel and stirred and mixed therein to prepare a mixed composition of these substances. The mixed composition is added with 2.0 parts by weight of benzophenone (produced by Kanto Chemical Co., Inc.) as a photopolymerization initiator and with 0.2 parts by weight of Michler's ketone (produced by Kanto Chemical Co., Ltd.) as a photosensitizer to obtain a solder resist composition (organic resin insulation material) having a viscosity adjusted to 2.0 Pa·s at 25° C. Meanwhile, the viscosity is measured by a rotor No. 4 when 60 rpm is obtained by a B type viscometer (produced by Tokyo Keiki Co., Ltd., DVL-B type) and measured by a rotor No. 3 when 6 rpm is obtained by the viscometer.

(14) Next, the solder resist composition is coated on the substrate 30 to a thickness of 20 μm and dried under the condition of 70° C. for 20 minutes and 30 minutes. Thereafter, a photo mask, which has a thickness of 5 mm and to which the pattern of the opening of the solder resist is written, is adhered to the solder resist layer 70, exposed by ultraviolet rays of 1000 mJ/cm$^2$, and developed by a DMTG solution to form an opening 71 having a diameter of 200 μm (refer to FIG. 6C).

(15) Next, by dipping the substrate, above which the solder resist layer (organic resin insulation layer) 70 is formed, is dipped in a nonelectrolyte nickel plating solution which has pH of 4.5 and contains nickel chloride ($2.3 \times 10^{-1}$ mol/l), sodium hypophosphite ($2.8 \times 10^{-1}$ mol/l), and sodium citrate ($1.6 \times 10^{-1}$ mol/l) for 20 minutes to form a 5 μm thick nickel-plated layer 72 onto the opening 71. Further, the substrate is further dipped in a nonelectrolyte plating solution containing gold kalium cyanide ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) under the condition of 80° C. for 7.5 minutes to form a 0.03 μm thick gold-plated layer 74 on the nickel-plated layer 72 thereby a solder pad 75 is formed on the conductor circuit 158 (refer to FIG. 6D).

(16) Thereafter, a solder paste is printed in each opening 71 of the solder resist layer 70 and reflowed at 200° C. to form a solder bump 76. With this arrangement, the multilayer printed wiring board 10 having the IC chip 20 built therein and the solder bump 76 can be obtained (refer to FIG. 7).

In the embodiment described above, a thermosetting cycloolefin resin sheet is used for the interlayer resin insulation layers 50 and 150. An epoxy resin film can also be used for the interlayer resin insulation layer 50 in place of the thermosetting cycloolefin resin sheet. The epoxy resin film contains an insoluble resin, soluble particles, a hardener, and the other components.

In the resin film used in the present invention, it is preferable that the soluble particles be approximately uniformly dispersed in the insoluble resin. This is because, even if the roughed surface having uniformly of rough irregularities can be formed and the via-hole and the through bore are formed in the resin film, the adhesiveness of the metal layer of the conductor circuit formed on the roughed surface can be secured. Further, the resin film containing the soluble particles may be used only on the surface layer having the roughed surface. With this arrangement, since the portion other than the surface layer of the resin film is not exposed to acid or oxidant, the insulation property between the conductor circuits can be securely held through the interlayer resin insulation layer.

Modified Example of First Embodiment

Figure 8:
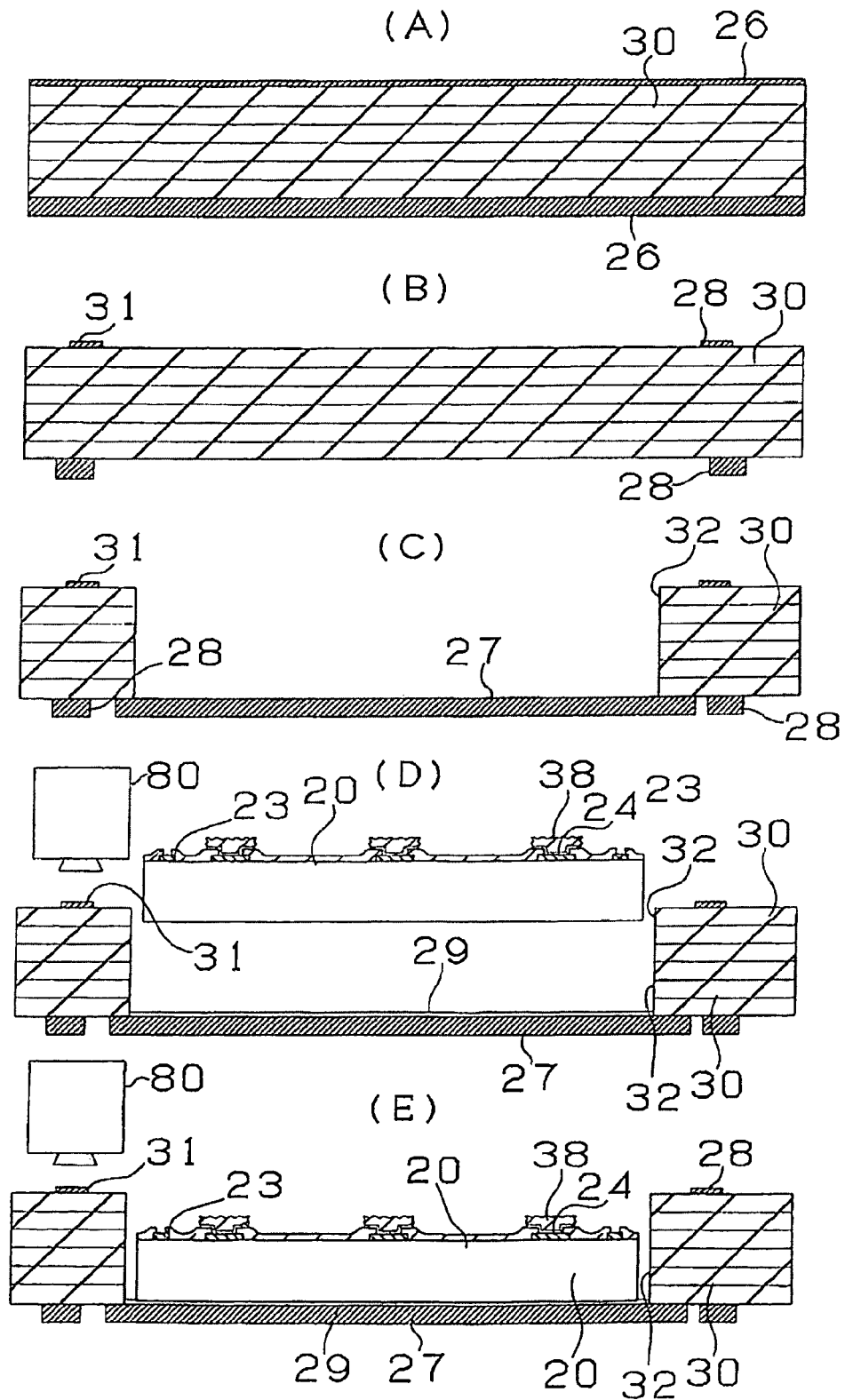
FIGS. 8A to 8E show steps of manufacturing a multilayer printed wiring board according to a modified example of the first embodiment.

A method for manufacturing a printed wiring board according to a modified example of the first embodiment will be described referring to FIG. 8. In the first embodiment, the resin tape is disposed on the bottom surface of the through bore 32 of the substrate. In the modified example of the first embodiment, a copper foil is employed in place of the resin tape.

The through bore 32 is formed, and a copper foil 27 as thick as the conductor circuit 28 on the back surface side is disposed on a bottom side (FIGS. 8A to 8C). Then, an adhesive 29 is coated on the copper foil 27, and the IC chip 20 is accommodated (FIGS. 8D and 8E). Since the subsequent steps are the same as those of the first embodiment, the explanation thereof is omitted. In the modified example of the first embodiment, since the copper foil 27 as thick as the conductor circuit 28 on the back surface side is used, the modified example can more increase the positioning accuracy of the IC chip 20 to the substrate 30 than the first embodiment.

Second Embodiment

Figure 11:
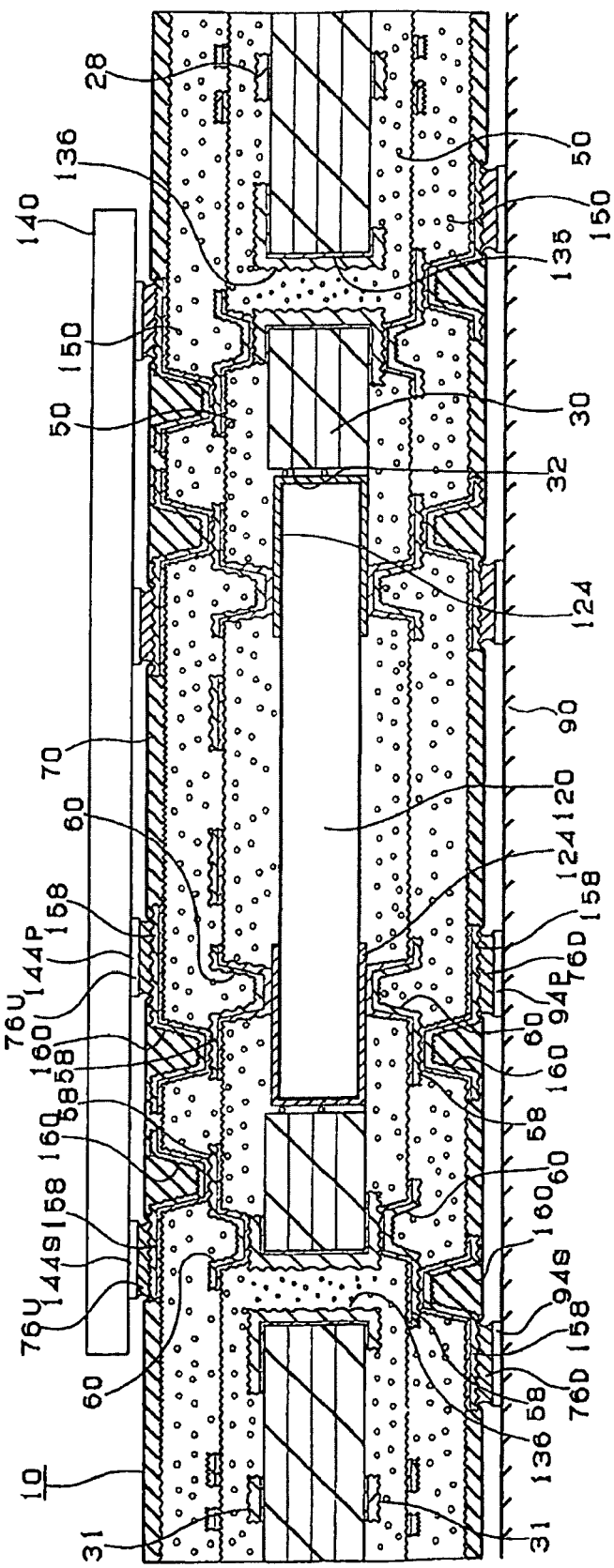
FIG. 11 is a sectional view of the multilayer printed wiring board according to the second embodiment.

Subsequently, a multilayer printed wiring board according to a second embodiment of the present invention will be described referring to FIG. 11.

In the first embodiment described above, the IC chip is accommodated in the multilayer printed wiring board. In contrast, in the second embodiment, a chip capacitor 120 is accommodated in a multilayer printed wiring board 10, and an IC chip 140 is mounted above the surface of the multilayer printed wiring board 10. The multilayer printed wiring board 10 is mounted on a daughter board 90.

Each power supply pad 144P of the IC chip 140 is connected to each terminal 124 of the chip capacitor 120 through via-hole 60-conductor circuit 58-via-hole 160-conductor circuit 158-solder bump 76U on the upper surface side of a core substrate 30. Each terminal 124 of the chip capacitor 120 is connected to each power supply pad 94P of the daughter board 90 through via-hole 60-conductor circuit 58-via-hole 160-conductor circuit 158-solder bump 76D on the lower surface side of the core substrate 30.

In contrast, each signal pad 144S of the IC chip 140 is connected to each signal pad 94S of the daughter board 90 through solder bump 76U-conductor circuit 158-via-hole 160-conductor circuit 58-via-hole 60-through bore 136 of core substrate 30-via-hole 60-conductor circuit 58-via-hole 160-conductor circuit 158-solder bump 76D.

In the second embodiment, a through bore 135, which constitutes the through bore 136 of the core substrate 30, is formed using an alignment mark 31 of the core substrate as a reference.

In the second embodiment, since the chip capacitor 120 is disposed just under the IC chip 140, the wiring length of the IC chip to the chip capacitor is reduced. Further, the wiring length of the chip capacitor 120 to the daughter board 90 is reduced because they are connected to each other on the lower surface of the chip capacitor 120. With this arrangement, a malfunction of the IC chip 140 due to voltage drop can be prevented by reducing a voltage drop in the wiring.

Figure 9:
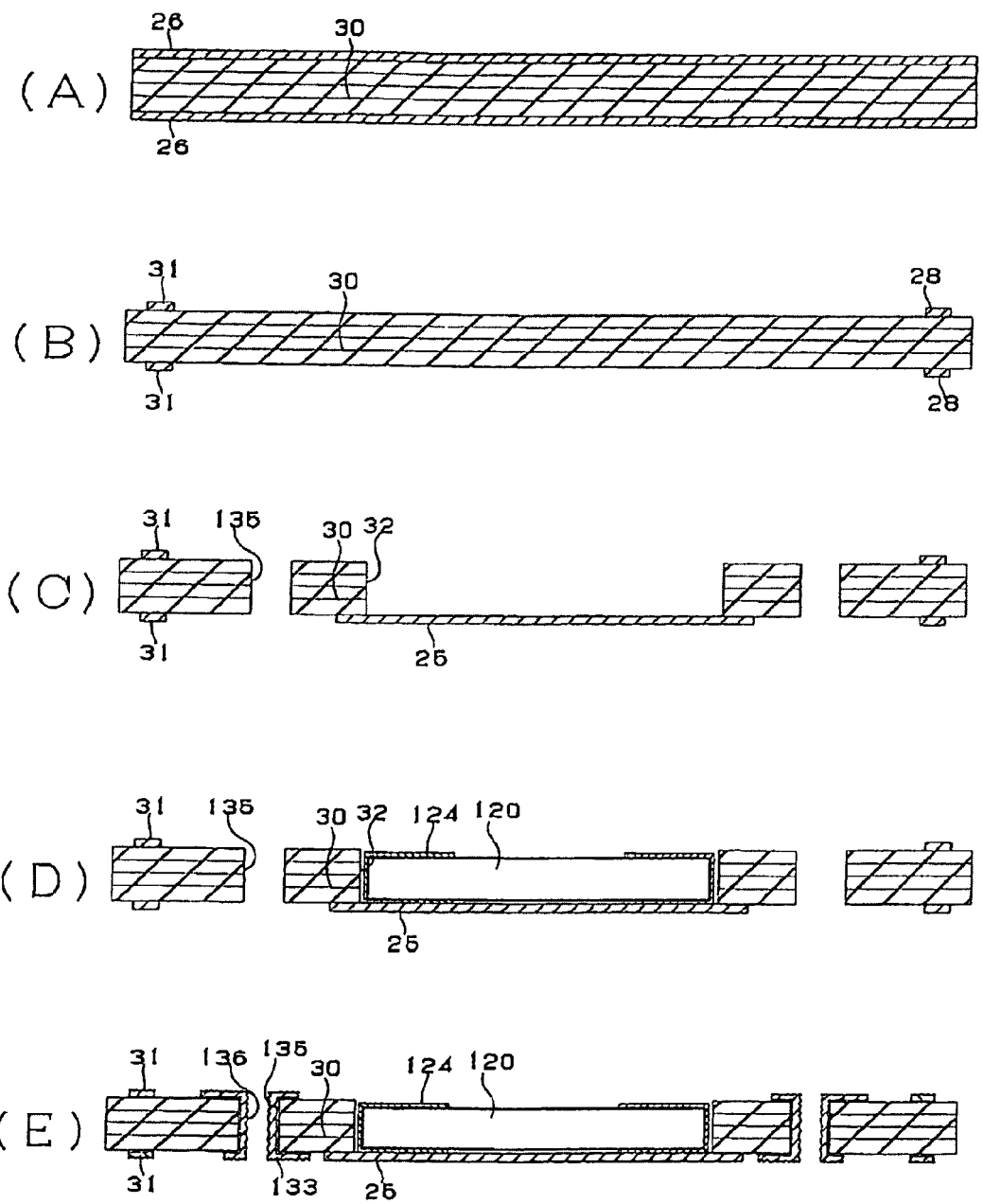
FIGS. 9A to 9E show steps of manufacturing a multilayer printed wirings plate according to a second embodiment of the present invention.
Figure 10:
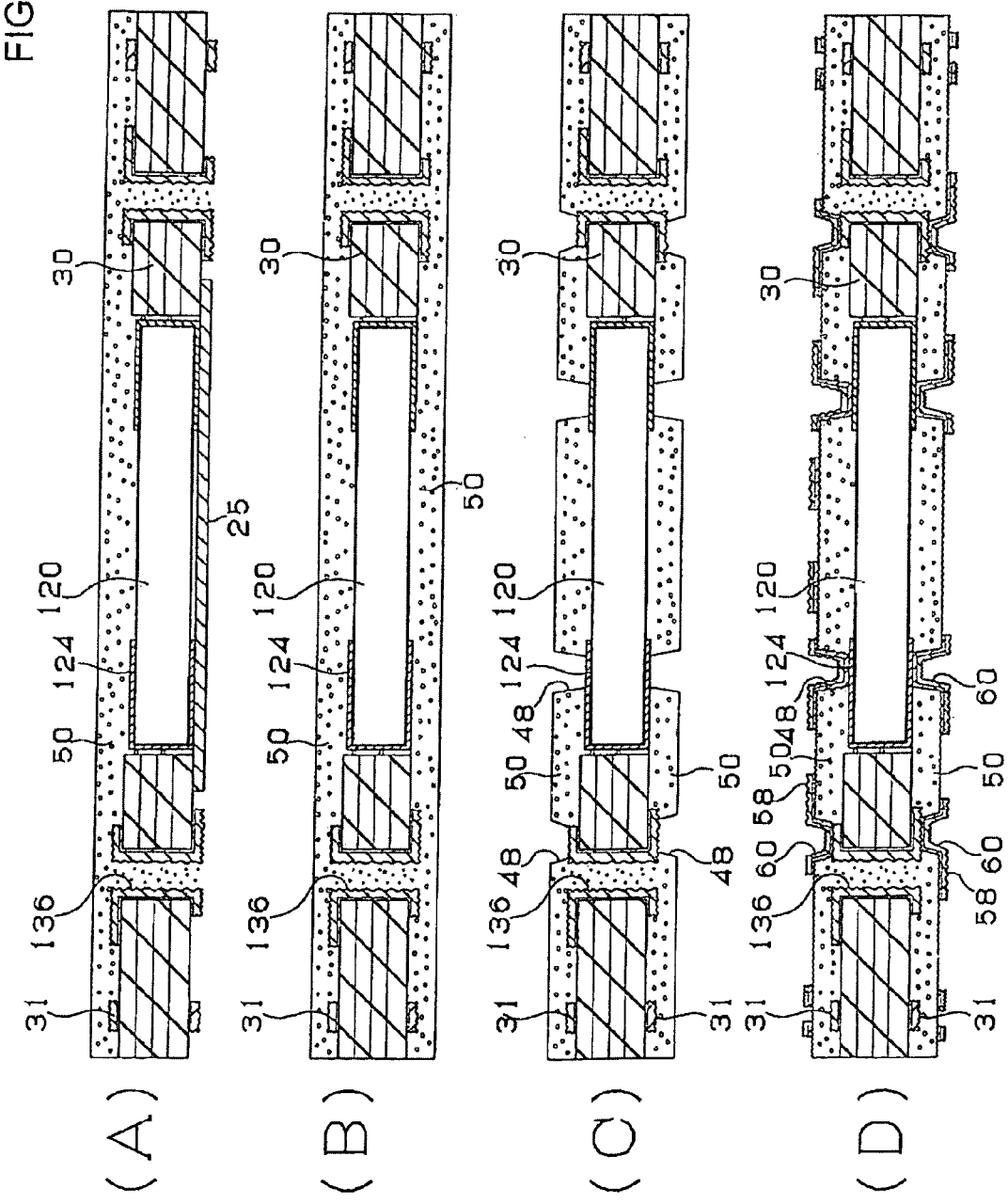
FIGS. 10A to 10D show steps of manufacturing the multilayer printed wiring board according to the second embodiment.

Subsequently, a method for manufacturing the multilayer printed wiring board 10 of the second embodiment will be described referring to FIGS. 9 and 10.

First, an insulation resin substrate (core substrate) 30 composed of a both-surface-copper-bonded and laminate sheet, which is prepared by overlapping prepregs, each of which is composed of a core material such as a glass cloth impregnated with a resin such as epoxy and laminating the prepregs on both surfaces of a copper foil 26, is used as a start material (refer to FIG. 9A). An etching resist having a predetermined pattern is formed onto the both surfaces of the copper foil 26, the copper foil 26 in the portion in which the etching resist is not formed is removed, and the alignment mark 31 and a conductor circuit 28 are formed by separating the etching resist (refer to FIG. 9B). Next, a through bore 32 for accommodating a chip capacitor and a through bore 135 for through hole are formed to the core substrate 30 and a resin tape 25 is bonded to the back surface side thereof (refer to FIG. 9C). Thereafter, the chip capacitor 120 is aligned with the through bore 32 using the alignment mark 31 of the core substrate 30 as a reference and is mounted on the tape 25 (refer to FIG. 9D). Then, the through bore 136 is formed by forming a plating film 133 to the through bore 135 (refer to FIG. 9E).

A 50 μm thick thermosetting cycloolefin resin sheet is laminated in vacuum press on the upper surface of a substrate 30 subjected to the steps described above at a pressure of 5 kg/cm$^2$ while increasing the temperature of the resin sheet to 50 to 150° C., thereby to form an interlayer resin insulation layer 50 composed of the cycloolefin resin (refer to FIG. 10A).

The resin tape 25 on the back surface side is separated and a thermosetting cycloolefin resin sheet is laminated in vacuum press on the back surface of the substrate 30 to form a lower surface interlayer resin insulation layer 50 (refer to FIG. 10B).

Next, alignment is performed by picking up the alignment mark 31 by the camera 80 through the upper and lower surface interlayer resin insulation layers 50, and an opening 48 having a diameter of 80 μm is formed in the upper and lower surface interlayer resin insulation layers 50 by a $CO_2$ gas laser (refer to FIG. 10C).

Thereafter, the conductor circuits 58 are formed on the upper and lower surface interlayer resin insulation layers 50, and the via-holes 60 are formed to the via-hole openings 48 similarly to the first embodiment (refer to FIG. 10D). An upper interlayer resin insulation layer 150, the conductor circuit 158, the via-hole 160, a solder resist 70, and the pads 76U and 76D are formed similarly to the first embodiment (refer to FIG. 11).

An electric connectivity can be improved since the IC chip and the chip capacitor can be securely connected to the via-holes of the interlayer resin insulation layers by the manufacturing method of the present invention even in the substrate in which the IC chip and the chip capacitor as electronic components are built in.

Third Embodiment

Figure 15:
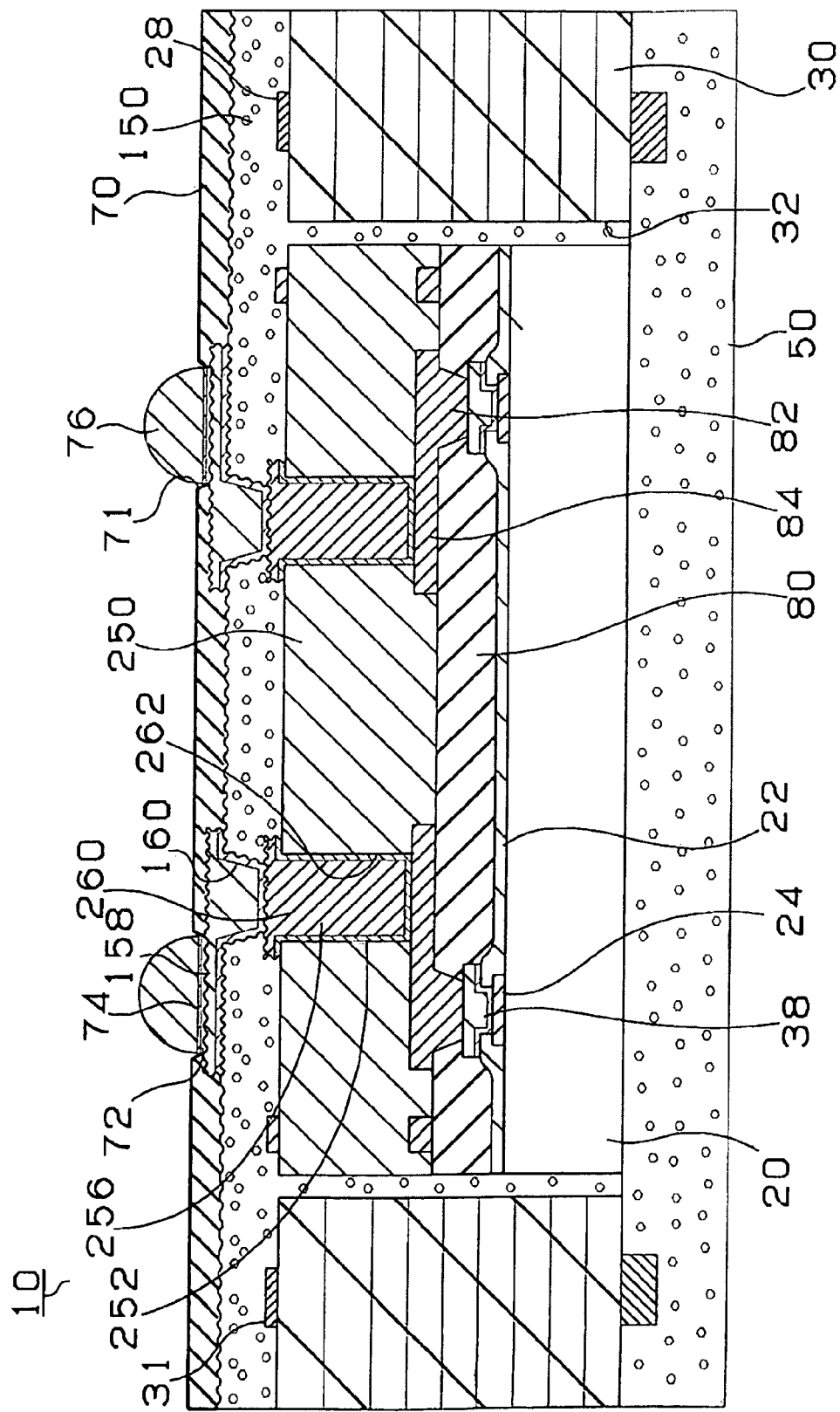
FIG. 15 is a sectional view of the multilayer printed wiring board according to the third embodiment.

A multilayer printed wiring board according to a third embodiment of the present invention will be described referring to FIG. 15.

The multilayer printed wiring board of the third embodiment is accommodated in an insulation resin substrate (core substrate) 30. A rewiring layer composed of a resin layer 80, via-holes 82, and a conductor circuit 84 is formed on an IC chip 20. An insulation resin layer 250 and columnar electrodes 260 are formed on the conductor circuit 84 constituting the redistribution layer. Further, a resin insulation layer 150, to which via-holes 160 and a conductor circuit 158 are formed, is disposed on the columnar electrode 260. Solder bumps 76 are disposed to the openings 71 of a solder resist layer 70 on the resin insulation layer 150.

Figure 12:
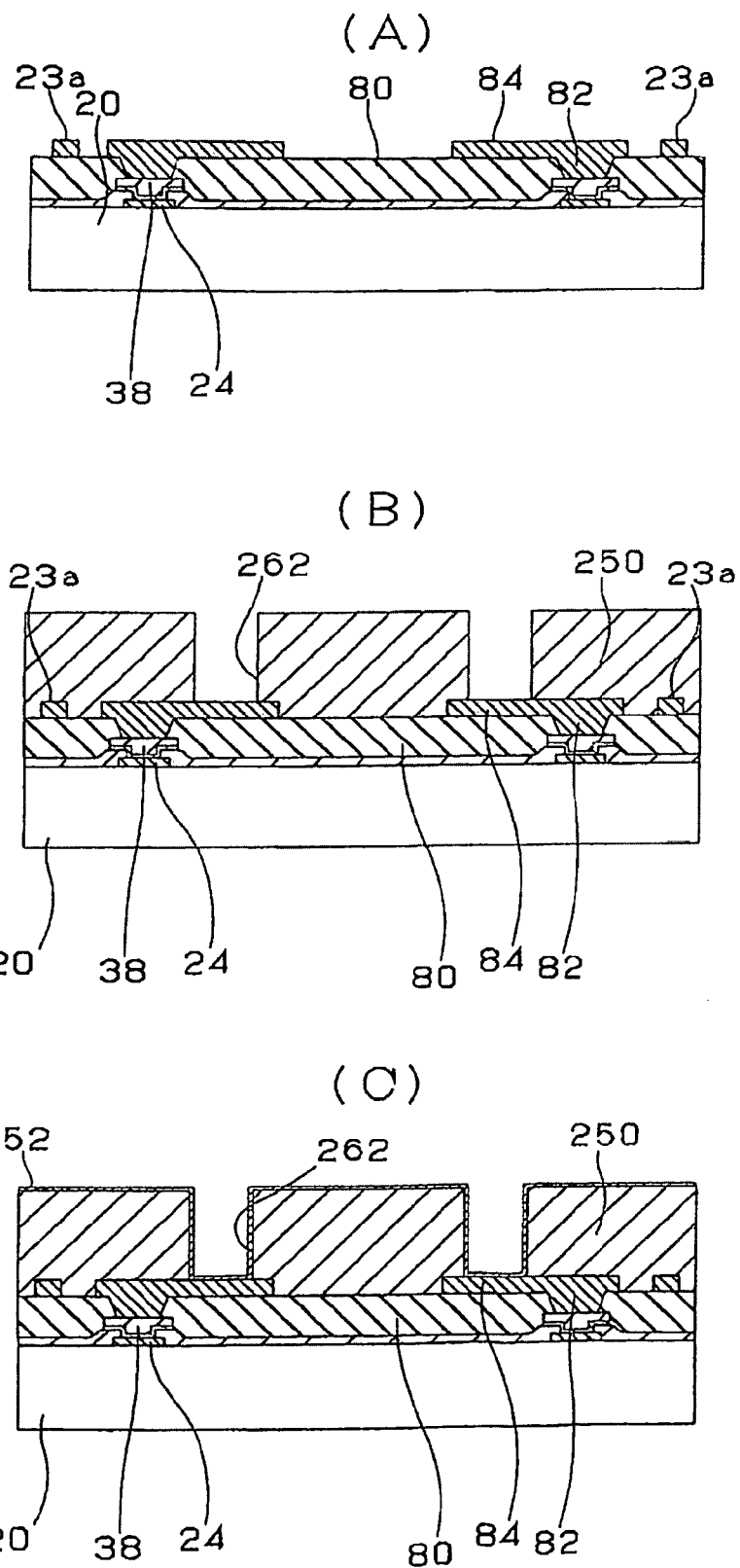
FIGS. 12A to 12C show steps of manufacturing a multilayer printed wiring board according to a third embodiment of the present invention.
Figure 13:
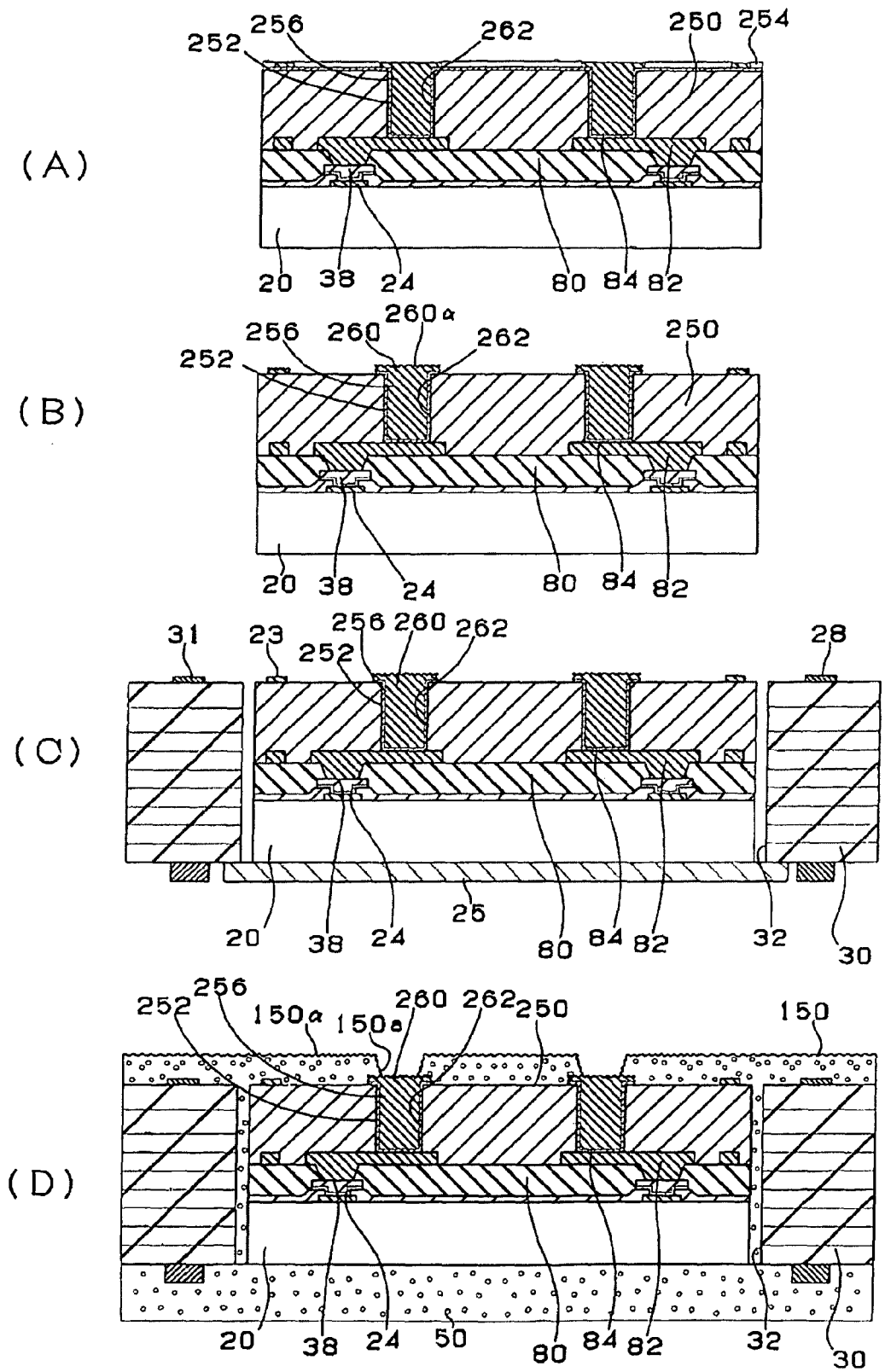
FIGS. 13A to 13D show steps of manufacturing the multilayer printed wiring board according to the third embodiment.
Figure 14:
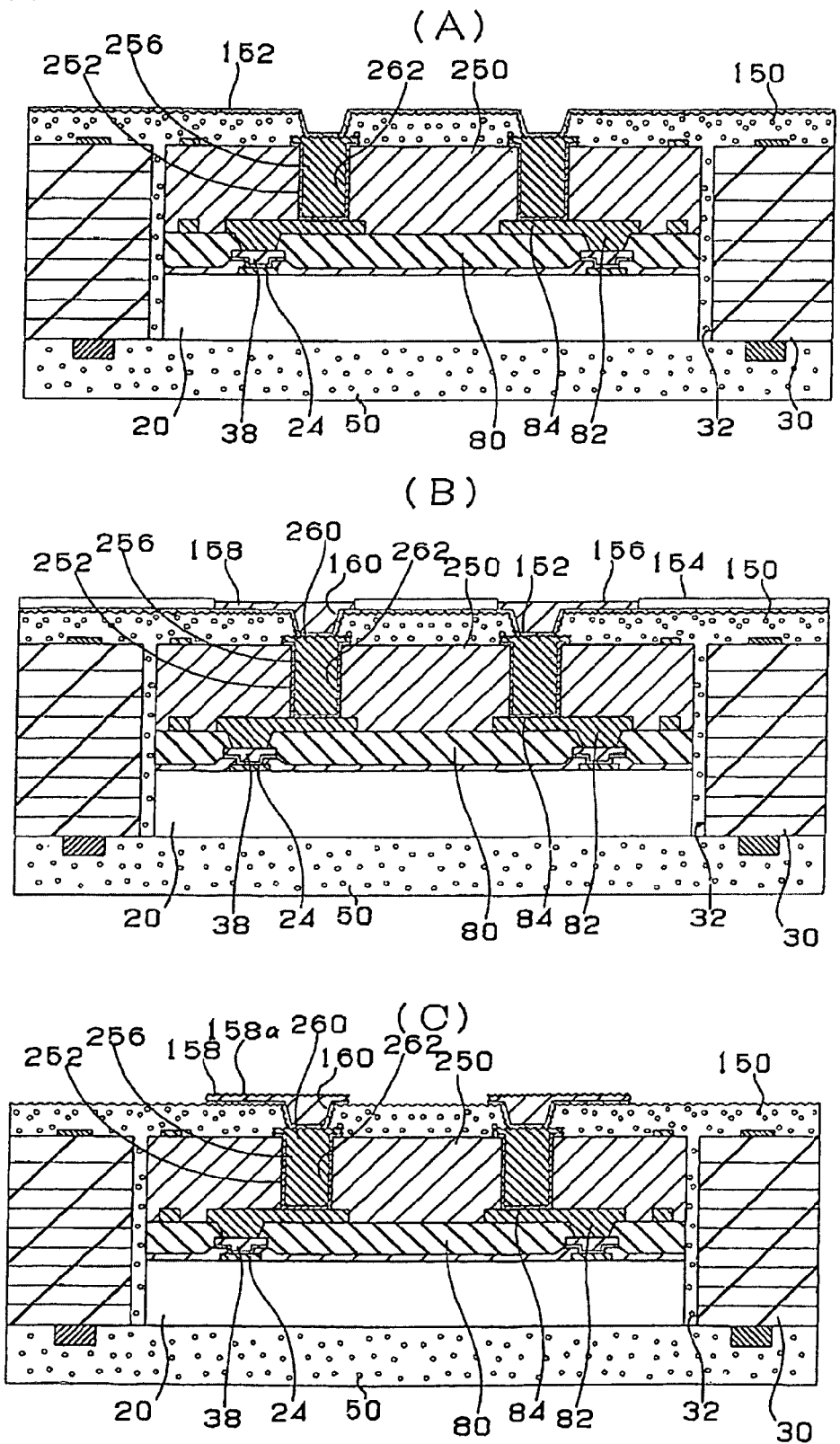
FIGS. 14A to 14C show steps of manufacturing the multilayer printed wiring board according to the third embodiment.

A method for manufacturing the multilayer printed wiring board of the third embodiment will be described referring to FIGS. 12 to 14.

The IC chip 20, to which the redistribution layer composed of the resin layer 80, the via-holes 82, and the conductor circuit 84 is formed, is prepared (FIG. 12A). The insulation resin layer 250 is formed on the upper surface of the IC chip 20. Then, cylindrical openings 262 are formed in the insulation resin layer 250 by laser using an alignment mark 23a of the IC chip 20 as a reference (FIG. 12B).

A nonelectrolyte copper plating film 252 is formed on the surfaces of the insulation resin layer 250 and in the openings 262 (FIG. 12C).

A plating resist 254 is formed, and an electrolytic copper plating 256 is formed to the portion to which the plating resist 254 is not formed and in the openings 262 (FIG. 13A).

The columnar electrodes 260 each composed of the nonelectrolyte copper plating film 252 and the electrolytic copper plating 256 are formed in the openings 262 by exfoliating the plating resist as well as removing the nonelectrolyte copper plating film 252 under the plating resist. Then, a surface-roughed layer 260α is formed to the portion of each columnar electrode 260 exposed from the insulation resin layer 250 (FIG. 13B).

A resin tape 25 is bonded to the bottom of the through bore 32 of the core substrate 30. Next, the IC chip 20 is aligned using the alignment mark 23 on the IC chip 20 by use of the alignment mark 31 of the core substrate 30 as a reference. The IC chip 20 is fully accommodated in the through bore 32 by pressing the upper surface thereof (FIG. 13C).

After the resin insulation layer 150 composed of the cycloolefin resin is formed on the insulation resin layer 250, the resin tape 25 on the back surface is separated. A resin layer 50 is formed on the back surface side of the core substrate. Then, via-hole openings 150a are formed to the resin insulation layer 150 using a $CO_2$ gas laser. Thereafter, a roughed surface 150α of the resin insulation layer 150 is formed by dipping the substrate in oxidant and the like (FIG. 13C).

A nonelectrolyte copper plating film 152 is formed on the interlayer resin insulation layer 150 (refer to FIG. 14A).

A plating resist 154 is disposed to the substrate 30 subjected to the above steps. Then, an electrolytic plating film 156 is formed by applying electrolytic plating to the substrate 30 (FIG. 14B).

After a plating resist 154 is exfoliated, the nonelectrolyte copper plating film 152 under the plating resist is dissolved and removed by etching. Then, the via-holes 160 and the conductor circuit 158 composed of the nonelectrolyte copper plating film 152 and the electrolytic plating film 156 are formed, and a roughed surface 158α is formed by an etching solution containing a second copper complex and an organic acid (refer to FIG. 14C).

Next, the solder resist layer 70 having the openings 71 is formed and a nickel-plated layer 72 and a gold-plated layer 74 are formed to the conductor circuit in each opening 71. Then, a solder paste is printed in each opening 71 of the solder resist layer 70 and reflowed to form a solder bump 76. With this arrangement, the multilayer printed wiring board 10 having the IC chip 20, to which the rewiring layer is formed, built therein, and the solder bump 76 can be obtained (refer to FIG. 15).

Fourth Embodiment

Figure 16:
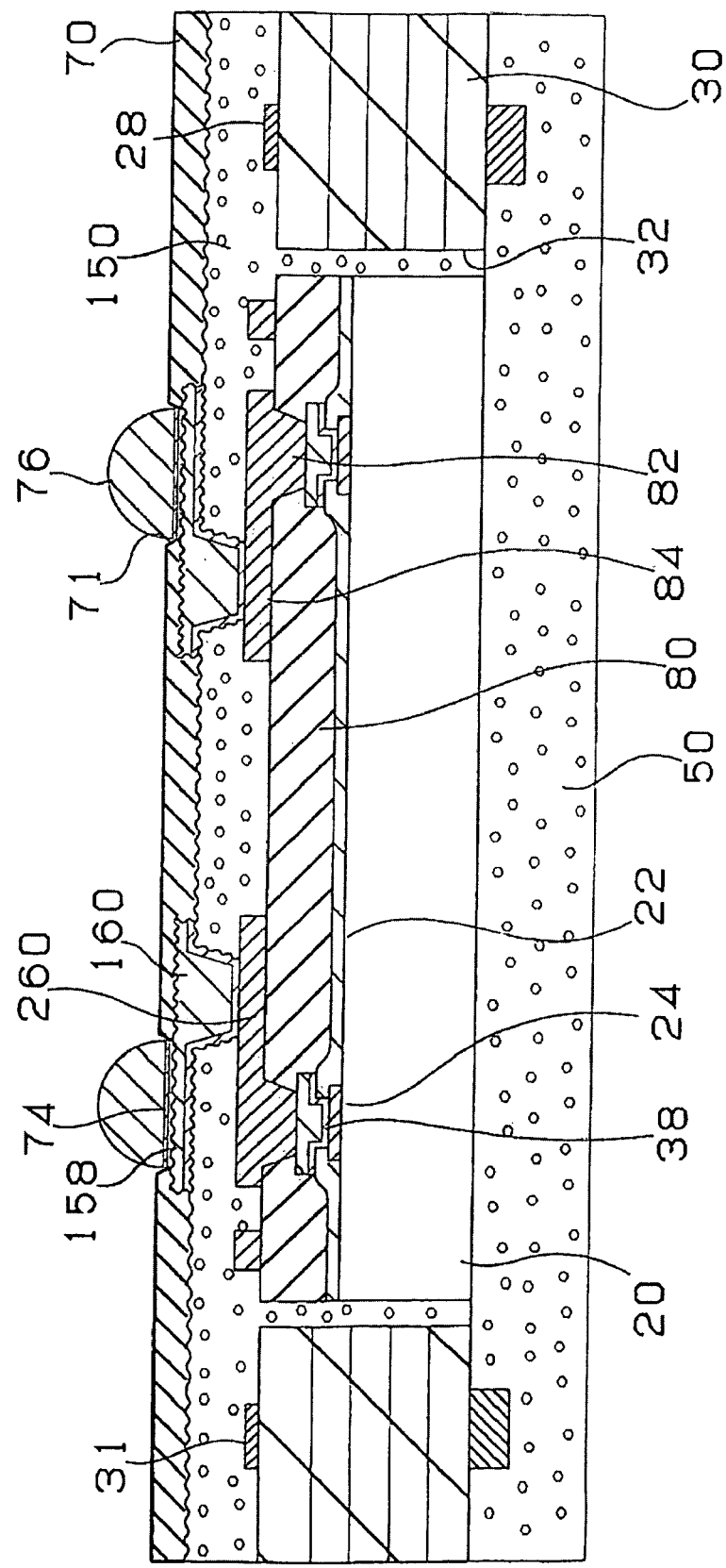
FIG. 16 is a sectional view of a multilayer printed wiring board according to a fourth embodiment of the present invention.

Subsequently, a multilayer printed wiring board of a fourth embodiment according to the present invention will be described referring to FIG. 16.

In the third embodiment described above, the columnar electrodes are formed on the conductor circuit of the redistribution layer of the IC chip, and the resin insulation layer 150 having the via-holes 160 and the conductor circuits 158 is formed on the columnar electrodes. In contrast, in the fourth embodiment, a resin insulation layer 150 having via-holes

160 and a conductor circuit 158 is formed on a conductor circuit 84 of a redistribution layer of an IC chip 20.

According to one aspect of the present invention, the conductor circuit and the first alignment mark are formed on the first surface of the substrate. The through bore is formed in the substrate, and a seal member for sealing the through bore is formed on the second surface of the substrate. Next, the electronic component is accommodated in the through bore based on the first alignment mark of the substrate. The interlayer insulation layer is formed on the first surface of the substrate, and the via-hole opening extending to the terminal of the electronic component is formed in the interlayer insulation layer based on the first alignment mark. Accordingly, since the image of the alignment mark can be easily recognized, the via-hole can be formed in the interlayer insulation layer on the substrate so that it is accurately aligned with the electronic component.

Processing can also be performed based on the first alignment mark. In this case an IC chip such as the electronic component or everything formed on the substrate may be subjected to processing. For example, an intermediation layer on the pad of the IC chip, recognition characters (alphabet, numerals, and the like), and positioning marks may be formed on the IC chip and the substrate.

Further, formation performed in this case indicates forming of everything formed on the interlayer insulation layer (which does not includes a reinforcing material such as a glass cloth and the like) disposed on a core substrate. Elements formed on the interlayer insulation layer include, for example, via-holes, wirings, recognition characters (alphabet, numerals, and the like), and positioning marks.

Although epoxy resin, BT resin, phenol resin, and the like impregnated with a reinforcing material and a core material such as glass epoxy resin and laminated prepregs impregnated with epoxy resin may be used as the resin substrate in which the electronic component such as the IC chip is built, materials ordinarily used for printed wiring boards can also be used. In addition to the above mentioned materials, a both-surface-copper-bonded and laminated sheet, a one-surface sheet, a resin sheet without a metal film, and a resin film can be used. However, resins are dissolved and carbonize at 350° C. or higher.

The IC chip used in the present invention may be any of a bare IC chip, an IC chip having an intermediation layer formed on a die pad to allow the die pad to be connected to the via-hole, an IC chip having a redistribution layer formed on a die pad, and an IC chip having a columnar electrode connected to a redistribution layer. Further, the redistribution layer may be formed of at least two layers.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a multilayer printed wiring board having an electronic component housed therein, the method comprising:
    forming a first conductor circuit on a first surface of a substrate;
    forming a first alignment mark on the first surface of the substrate separate from the conductor circuit, wherein the forming a first conductor circuit and the forming a first alignment mark are performed simultaneously in a same process step;
    forming a through opening in the substrate, the through opening extending from the first surface of the substrate to a second surface of the substrate;
    disposing a seal member on the second surface of the substrate, the seal member sealing an opening on the second surface of the through opening to provide a sealed through opening;
    inserting an electronic component in the sealed through opening using the first alignment mark on the first surface of the substrate;
    forming a first interlayer insulating layer on the first surface of the substrate and on the electronic component; and
    forming a first via hole opening in the first interlayer insulating layer by using the first alignment mark to align the first via hole opening with a terminal of the electronic component such that electrical connection can be made to the electronic component by way of the first via hole opening.

2. The method of claim 1, further comprising
    forming a second alignment mark on the second surface of the substrate.

3. The method of claim 2, further comprising:
    forming a second interlayer insulating layer on the second surface of the substrate; and
    forming a second via hole opening in the second interlayer insulating layer by using the second alignment mark to align the second via hole opening with a second terminal of the electronic component such that electrical connection can be made to the electronic component by way of the second via hole opening.

4. The method of claim 1, wherein said inserting the electronic component comprises inserting an integrated circuit (IC) chip into the sealed through opening in the substrate by using the first alignment mark to align the IC chip with the sealed through opening.

5. The method of claim 4, wherein said inserting an IC chip into the sealed through opening comprises inserting an IC chip having another alignment mark provided on a surface of the IC chip into the sealed through opening.

6. The method of claim 5, wherein said inserting the IC chip comprises inserting the IC chip into the sealed through opening by using both the first alignment mark on the substrate and the another alignment mark on the IC chip to align the IC chip with the sealed through opening.

7. The method of claim 4, wherein said inserting an IC chip into the sealed through opening comprises inserting an IC chip having an intermediate conductor layer provided on a pad of the IC chip into the sealed through opening.

8. The method of claim 7, wherein said forming a first interlayer insulating layer comprises forming an interlayer insulating layer on the substrate and the IC chip; and
    said forming a first via hole opening comprises forming a via hole opening in the interlayer insulating layer by using the first alignment mark on the substrate to align the via hole opening with the intermediate conductor layer of the IC chip such that electrical connection can be made to the IC chip by way of the via hole opening.

9. The method of claim 7, wherein said inserting an IC chip into the sealed through opening comprises inserting an IC chip, having the intermediate conductor layer larger than the pad, into the substrate.

10. The method of claim 1, wherein said inserting the electronic component comprises inserting a chip capacitor into the substrate by using the first alignment mark on the substrate to align the chip capacitor with the sealed through opening.

11. The method of claim 10, further comprising:
forming a second alignment mark on a second surface of the substrate, said second surface opposing the first surface;
forming a second interlayer insulating layer on the second surface of the substrate; and
forming a second via hole opening in the second interlayer insulating layer by using the second alignment mark to align the second via hole opening with a second terminal of the chip capacitor such that electrical connection can be made to the chip capacitor by way of the second via hole opening.

12. The method of claim 11, further comprising:
forming an integrated circuit (IC) chip over said first interlayer insulating layer on the first surface of the substrate such that the IC chip is electrically connected to the terminal of the chip capacitor through the first interlayer insulating layer; and
forming a daughter board over said second interlayer insulating layer on the second surface of the substrate such that the IC chip is electrically connected to the terminal of the chip capacitor through the second interlayer insulating layer.

13. The method of claim 1, further comprising:
forming a second conductor circuit and a second alignment mark on the second surface of the substrate;
separating the seal member from the second surface of the substrate to expose the electronic component;
forming a second interlayer insulation layer on the second surface of the substrate and on the electronic component; and
forming at least one second via-hole opening in the second interlayer insulating layer, which extends a terminal of the electronic component, in the second interlayer insulation layer based on the second alignment mark of the substrate.

14. The method of claim 1, wherein a metal foil is used as the seal member.

15. The method of claim 1, wherein a space between a wall surface of the sealed through opening and a side surface of the electronic component is filled with resin from the interlayer insulation layer at the forming the interlayer insulation layer on the first surface on the substrate.

16. The method of claim 1, wherein said inserting the electric component comprises inserting the electronic component in the sealed through opening so that a clearance formed between a wall surface of the sealed through opening and a side surface of the electric component is set from 30 to 200 µm.

17. The method of claim 1, wherein the forming the first alignment mark includes forming a raised alignment mark above the first surface of the substrate.

18. A method for manufacturing a multilayer printed wiring board having an electronic component housed therein, the method comprising:
forming a passivation layer over a connection terminal of the electronic component;
forming an opening in the passivation layer to expose the connection terminal;
forming an intermediate conductor in contact with the connection terminal;
forming a conduction circuit on a substrate and forming an alignment mark on the substrate separate from the conduction circuit but formed simultaneously with the forming a conduction circuit;
forming a through opening in the substrate;
inserting the electronic component having the intermediate conductor thereon into the through opening in the substrate by using the alignment mark on the substrate to align the electronic component with the through opening.

* * * * *